(12) United States Patent
Hsu et al.

(10) Patent No.: US 7,142,742 B2
(45) Date of Patent: Nov. 28, 2006

(54) METHOD FOR ARRANGING CONDUCTING LINES OF A FLEXIBLE CABLE IN AN OPTICAL DISK DRIVE

(75) Inventors: Jen-Yu Hsu, Taipei (TW); Chia-Yuan Pang, Taipei (TW); Song-Feng Tsai, Taipei (TW); Yao-Chou Tsai, Taipei (TW)

(73) Assignee: Lite-On It Corporation, Taipei (TW)

( * ) Notice: Subject to any disclaimer, the term of this patent is extended or adjusted under 35 U.S.C. 154(b) by 288 days.

(21) Appl. No.: 10/710,617

(22) Filed: Jul. 25, 2004

(65) Prior Publication Data

US 2005/0031294 A1 Feb. 10, 2005

(30) Foreign Application Priority Data

Aug. 8, 2003 (TW) .............................. 92121928 A

(51) Int. Cl.
*G02B 6/12* (2006.01)
*G02B 6/26* (2006.01)
*G02B 6/42* (2006.01)
*G11B 7/00* (2006.01)

(52) U.S. Cl. ............................ 385/16; 385/14; 385/15; 385/31; 385/100; 369/114; 369/116; 369/121

(58) Field of Classification Search .................. 385/16
See application file for complete search history.

(56) References Cited

U.S. PATENT DOCUMENTS 6,636,472 B1 * 10/2003 Kurebayashi et al. ........ 369/116
2005/0141395 A1 * 6/2005 Nakatani ..................... 369/116
2005/0265155 A1 * 12/2005 Iwano et al. ................ 369/47.1

* cited by examiner

*Primary Examiner*—Frank G. Font
*Assistant Examiner*—Mary El-Shammaa
(74) *Attorney, Agent, or Firm*—Winston Hsu

(57) ABSTRACT

A method for arranging conducting lines of a flexible cable in an optical disk drive first confirms the pins having similar functions of all chips on a main board and a sub-board, and uses only one conducting line of the flexible cable to connect these pins. Therefore, the number of the conducting lines of the flexible cable can be reduced.

4 Claims, 3 Drawing Sheets

METHOD FOR ARRANGING CONDUCTING LINES OF A FLEXIBLE CABLE IN AN OPTICAL DISK DRIVE

BACKGROUND OF INVENTION

1. Field of the Invention

The present invention relates to a method for arranging conducting lines among the control chips in an optical disk drive, and more particularly, to a method for arranging conducting lines among the control chips in a slim-type optical disk drive.

2. Description of the Prior Art

Please refer to FIG. 1. FIG. 1 is a layout of a slim-type optical disk drive according to the prior art. Generally, the circuit board of the slim-type optical disk drive is divided into two parts. A sub-board 20 is located on a movable tray and a main board 10 is located in the housing.

The main board 10 includes an analog signal microprocessor 12, a DSP/decoder microprocessor 14, a flash ROM chip 16, and a SDRAM chip 18. A first flexible cable 15 between the two boards 10 and 20 is used for transmitting all signals between the main board 10 and the subboard 20. Therefore, no matter whether the movable tray is positioned in or out, the signals of the sub-board 20 can still reach the main board 10.

The sub-board 20 includes a spindle motor 22, a spindle motor drive 24, an optical pickup head 30, and a sliding track (not shown in FIG. 1). The optical pickup head 30 can move on the sliding track. The optical pickup head 30 includes a laser diode 32, a laser diode drive chip 34, and a photo detector chip 36. Therefore, a second flexible cable 25 is used for connecting the optical pickup head 30 with the sub-board 20 so as to transmit signals between the optical pickup head 30 and the sub-board 20.

As technology advances, the slim-type optical disk drive has been developed to increase the rotation speed of the spindle motor. This makes it more complex to control the entire optical disk drive. That is, the design of the spindle motor drive chip 24 on the sub-board 20 and the laser diode drive chip 34 and the photo detector chip 36 of the optical pickup head 30 becomes complicated. Therefore, control signals must be added in these control chips in response to the more complex design. Adding control signals means that the pin counts of these control chips increase. Thus, the conducting lines of the flexible cables 15 and 25 must also be increased.

However, the prior art flexible cables 15 and 25 conform to the current cable standard; that is, the number of conducting lines is limited. Thus such cables are inexpensive. If flexible cables not conforming to the current cable standard are required, the cost of the slim-type optical disk drive increases due to the new design of such new flexible cables with a special number of the conducting lines.

SUMMARY OF INVENTION

It is therefore a primary objective of the claimed invention to provide a method of arranging conducting lines of a flexible cable in an optical disk drive to solve the problems mentioned above.

The present invention provides a method for arranging conducting lines of a flexible cable in an optical disk drive. The method comprises connecting a signal of a first circuit board to a first node, providing a plurality of control chips and selecting a pin from each control chip, connecting a second node of a second circuit board to the selected pins of the control chips, and connecting the first node to the second node through a conducting line of a flexible cable.

The present invention provides a method for arranging conducting lines of a flexible cable in an optical disk drive. The method comprises connecting a signal of a first circuit board to a first node, connecting the first node to a second node of a second circuit board through a conducting line of a flexible cable, providing a plurality of control chips and selecting a pin from each control chip, disposing a NOT gate on the second circuit board, the input of the NOT gate being connected to the second node, and connecting the selected pins of the control chips to the second node or to the output of the NOT gate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
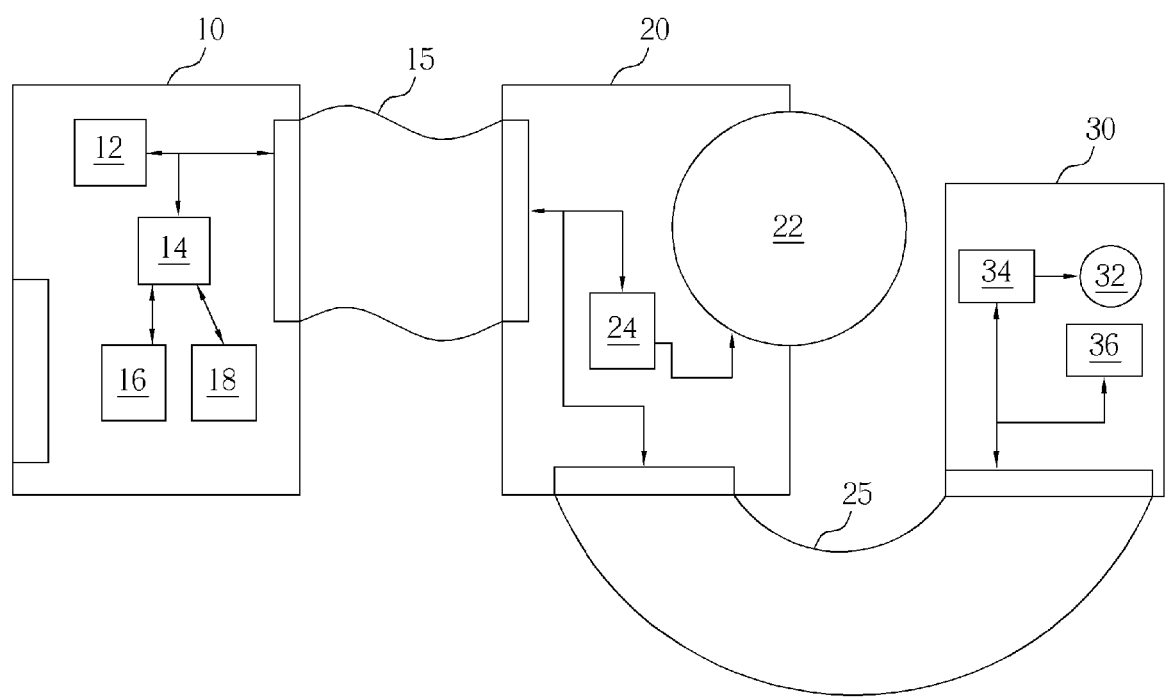
FIG. 1 is a layout of a slim-type optical disk drive according to the prior art.

The present invention aims to maintain or reduce the number of the conducting lines of a flexible cable, and provide for functions of all pins of the spindle motor drive chip 24 on the sub-board 20 and the laser diode drive chip 34 and the photo detector chip 36 of the optical pickup head 30. That is, the present invention provides only one conducting line to signals having similar function for connecting the main board 10 with the sub-board 20.

Figure 2:
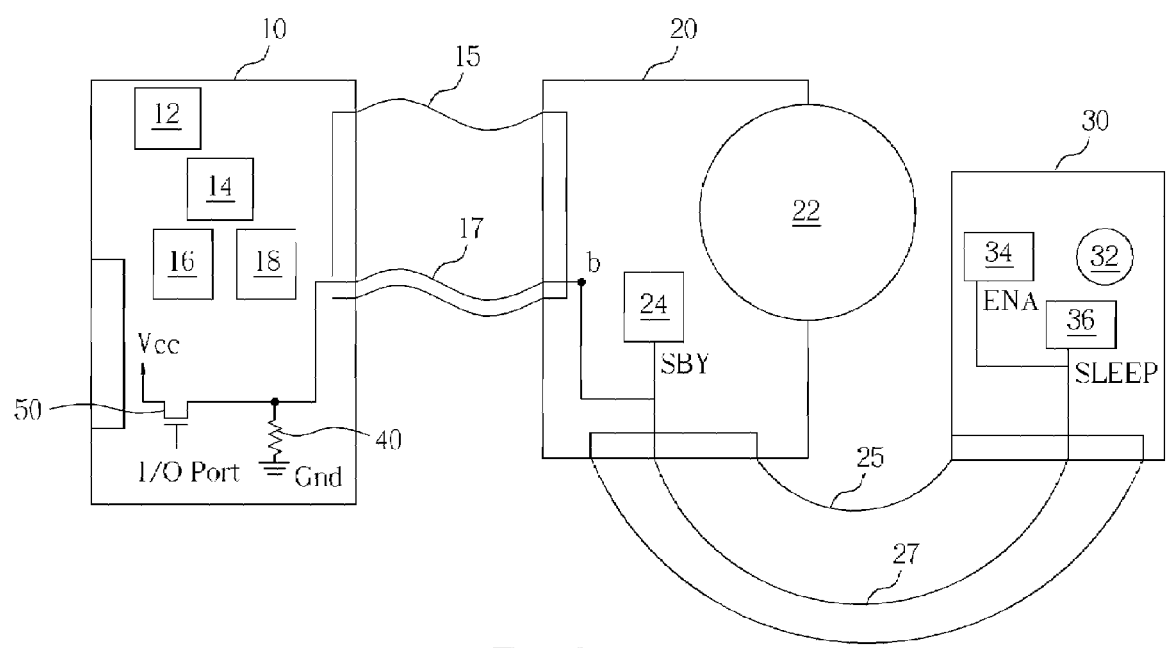
FIG. 2 is a diagram of a slim-type optical disk drive according to the present invention.

Please refer to FIG. 2. FIG. 2 is a diagram of a slim-type optical disk drive according to the present invention. First, a switch circuit 50, such as a FET, is disposed between a voltage source Vcc and a first node "a" on the main board 10, and an I/O port is used for controlling the switch circuit 50. Next, a pull-down resister 40 is disposed between the first node "a" and ground (Gnd). Therefore, when the state of the switch circuit 50 is off, the voltage of the first node "a" is the ground voltage. When the state of the switch circuit 50 is on, the voltage of the first node "a" is the voltage Vcc. A conducting line 17 of a first flexible cable 15 is used for connecting the first node "a" on the main board 10 with a second node "b" on the sub-board 20.

Generally speaking, most control chips have an enable pin (ENA), a sleep pin (SLEEP), or a standby pin (SBY) for eliminating power consumption. When the control chips start to work, a start signal must be provided to the pins mentioned above for starting the control chips to receive other control signals.

Therefore, as shown in FIG. 2, the second node "b" is connected to a SBY pin of the spindle motor drive chip 24. Moreover, the second node "b" is connected to an ENA pin of the laser diode drive chip 34 and a SLEEP pin of the photo detector chip 36 through a conducting line 27 of a second flexible cable 25. Thus, when the optical dick drive is powered on, only the I/O port is used to control the switch circuit 50 so as to start many control chips by the start signal at the same time and make the optical disk drive work normally.

Figure 3:
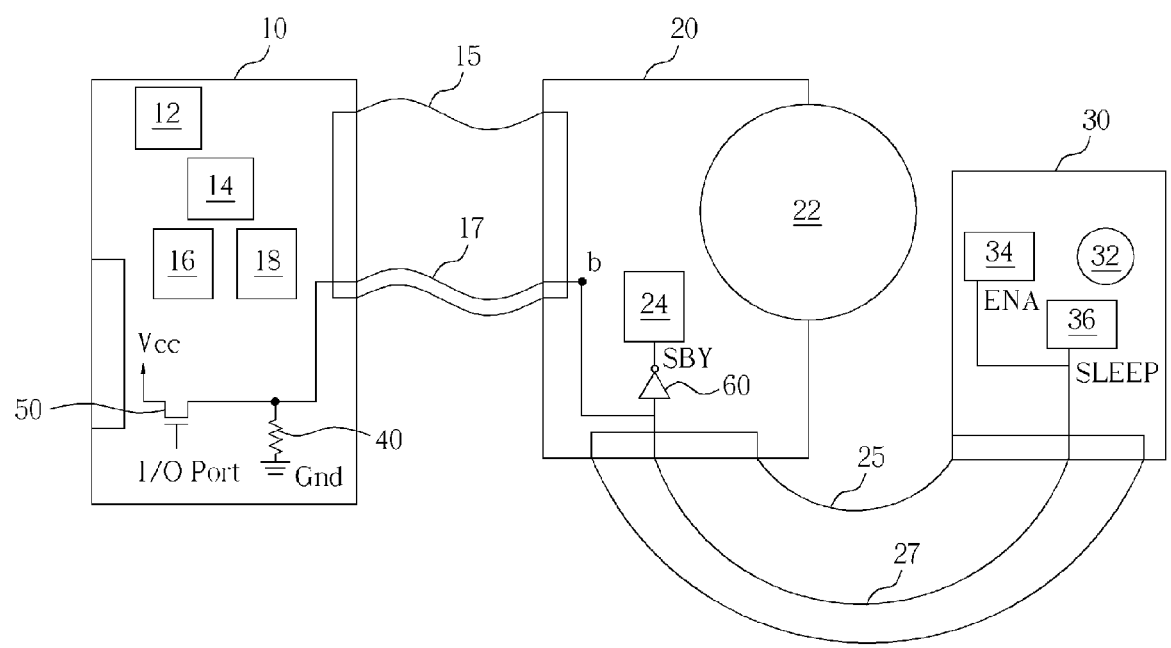
FIG. 3 is another diagram of a slim-type optical disk drive according to the present invention.

In addition, the pins of these control chips, such as the ENA pin, the SLEEP pin, or the SBY pin, might have to be at high or low level to be activated. Therefore, a NOT gate (i.e. an inverter) is disposed at the special pin before the start signal is input. For instance, please refer to FIG. 3. FIG. 3 is another diagram of a slim-type optical disk drive according to the present invention. Suppose that the SBY pin of the spindle motor drive chip 24 is activated at high level while the ENA pin of the laser diode drive chip 34 and the SLEEP pin of the photo detector chip 36 are activated at low level. Therefore, a NOT gate 60 must be disposed on the sub-board 20, as shown in FIG. 3. When the start signal is at low level, the spindle motor drive chip 24, the laser diode drive chip 34, and the photo detector chip 36 are started simultaneously.

Compared to the prior art, the present invention provides a method for arranging conducting lines of a flexible cable in an optical disk drive. The present invention specifies first identifying the pins having similar functions of all chips on both boards 10 and 20 and using only one conducting line of the flexible cable to connect all the pins. Therefore, the present invention can reduce the number of conducting lines of the flexible cable.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for arranging conducting lines of a flexible cable in an optical disk drive, the flexible cable used between a first circuit board and a second circuit board, the method comprising:

generating a control signal for the optical disk drive, a switch circuit located on the first circuit board and being controlled by an input signal to generate the control signal, wherein when the input signal turns the switch circuit on, the control signal has a first voltage level, and when the input signal turns the switch circuit off, the control signal has a second voltage level;

transmitting the control signal from a first node on the first circuit board to a second node on the second circuit board through a conducting line of the flexible cable:

connecting a pin of a first control chip located on the first circuit board to the first node for receiving the control signal; and connecting a pin of a second control chip located on the second circuit board to the second node for receiving the control signal, wherein the first control chip and the second control chip are controlled by the same control signal.

2. The method of claim 1 wherein the optical disk drive is a slim-type optical disk drive.

3. A method for arranging conducting lines of a flexible cable in an optical disk drive, the flexible cable used between a first circuit board and a second circuit board, the method comprising:

generating a control signal for the optical disk drive, a switch circuit located on the first circuit board and being controlled by an input signal to generate the control signal, wherein when the input signal turns the switch circuit on, the control signal has a first voltage level, and when the input signal turns the switch circuit off, the control signal has a second voltage level;

transmitting the control signal from a first node on the first circuit board to a second node on the second circuit board through a conducting line of the flexible cable;

connecting a pin of a first control chip located on the first circuit board to the first node for receiving the control signal;

connecting an input of a NOT gate to the second node; and connecting a pin of a second control chip located on the second circuit board to an output of the NOT gate for receiving a logical inverse of the control signal.

4. The method of claim 3 wherein the optical disk drive is a slim-type optical disk drive.

* * * * *